United States Patent
Teo et al.

(10) Patent No.: US 7,842,135 B2
(45) Date of Patent: Nov. 30, 2010

(54) EQUIPMENT INNOVATIONS FOR NANO-TECHNOLOGY AQUIPMENT, ESPECIALLY FOR PLASMA GROWTH CHAMBERS OF CARBON NANOTUBE AND NANOWIRE

(75) Inventors: Kenneth Boh Khin Teo, Cambridge (GB); Nalin Lalith Rupesinghe, Cambridge (GB)

(73) Assignee: Aixtron AG, Herzogenrath (DE)

( * ) Notice: Subject to any disclaimer, the term of this patent is extended or adjusted under 35 U.S.C. 154(b) by 883 days.

(21) Appl. No.: 11/327,975

(22) Filed: Jan. 9, 2006

(65) Prior Publication Data

US 2007/0169702 A1 Jul. 26, 2007

(51) Int. Cl.
C23C 16/00 (2006.01)
(52) U.S. Cl. .......... 118/725; 118/723 R; 118/723 E; 118/728
(58) Field of Classification Search .......... 118/725, 118/723 R, 723 E, 728
See application file for complete search history.

(56) References Cited

U.S. PATENT DOCUMENTS

| | | | | |
|---|---|---|---|---|
| 4,384,192 A | * | 5/1983 | Lowell et al. | 219/465.1 |
| 5,545,258 A | * | 8/1996 | Katayama et al. | 118/723 MP |
| 6,132,512 A | * | 10/2000 | Horie et al. | 118/715 |
| 6,190,460 B1 | * | 2/2001 | Hwang | 118/729 |
| 6,652,655 B1 | * | 11/2003 | Ho | 118/725 |
| 6,706,645 B2 | * | 3/2004 | Morita et al. | 438/778 |
| 6,888,106 B2 | * | 5/2005 | Hiramatsu | 219/444.1 |
| 2002/0139658 A1 | * | 10/2002 | Kanakasabapathy et al. | 204/164 |
| 2004/0099215 A1 | * | 5/2004 | Danek et al. | 118/723 E |
| 2004/0134613 A1 | * | 7/2004 | Ohmi et al. | 156/345.41 |

* cited by examiner

Primary Examiner—Michael Cleveland
Assistant Examiner—Keath T Chen
(74) Attorney, Agent, or Firm—SNR Denton US LLP

(57) ABSTRACT

Nano-technology is an emerging and intensely competitive field. There are a number of companies that work mainly in the development of various Nano-technology areas. One area that has not received too much emphasis is that of specialized equipment for Nano-technology. Nanoinstruments is a company working to rectify this deficiency in the field of nano-material deposition, especially in Carbon Nanotube and Nanowire growth. A number of innovations disclosed include the use of a low thermal mass heating unit that allows fast changes in temperature of the growth sample while providing sufficient thermal stability, uniformity and electrical isolation, a novel shower head design for providing uniform gas flow while eliminating thermal and plasma decomposition of feed stock at the nozzle, a pulsed voltage waveform that eliminates charging of substrate on which the growth has to take place, and the use of a conductive grid over insulating substrates to achieve uniform plasma over the growth surface.

17 Claims, 3 Drawing Sheets

Showehead cross section

Fast response-low thermal mass heater

Isolation method for small conductive substrates in a low cost small chamber

Isolation and Biasing method for large conductive substrates using Fast response, Low thermal mass heaters

Showehead cross section

Modification of Biasing for Plasma enhanced growth on insulating substrates

Pulse dc waveform for carbon nanotube growth on insulating or mixed insulating/conductive substrates.

EQUIPMENT INNOVATIONS FOR NANO-TECHNOLOGY AQUIPMENT, ESPECIALLY FOR PLASMA GROWTH CHAMBERS OF CARBON NANOTUBE AND NANOWIRE

FIELD OF INVENTION

This invention relates to equipments for Nano-technology development, and specifically to Chemical Vapour Deposition (CVD) and plasma enhanced CVD growth furnaces, which may be constructed as vacuum chambers, for nano material deposition, especially for growth of Carbon nanotubes and semiconducting nanowires.

INTRODUCTION

Although Nano-technology is a fast growing and developing area, and a number of institutions and universities are engaged in research and development, there has been little or no incentive for equipment companies to provide support to these endeavors. This is due to the fact that the number of units needed by the research community is very small and such units are typically put together in the labs. This has a very limiting impact on the ongoing development and acceleration of manufacturing. The present inventors have taken this as a challenge and have been involved in developing equipment technology suitable for the use in Nano-technology applications. They have initially concentrated on the area of Carbon Nanotubes and Nanowires and have developed a number of innovative ideas that solve some of the problems of the equipments available today for Nano-technology applications, for the deposition of nano-materials, especially for the deposition of Carbon Nanotubes and Nanowires.

BACKGROUND INFORMATION

Nano technology is becoming the next frontier of development and advancement in science. This has been clearly indicated by the R&D investments in Nano-applications in the past few years. Currently the most advanced areas of Nano-technology are the field of genetics and the field of nano-structure growth. The Nano-structure growth field has been fueled mainly by advances in the area of materials. One such area is the area of Carbon Nanotubes and semi-conducting Nanowires. Even though interest is high in the nano-technology area, the development of equipments for the manufacture of such material has lagged, as the market is not yet large enough to attract leading equipment vendors into this area.

Typically Carbon Nanotubes are grown in the labs through four different processes. They are:
  a) Electric arc discharge techniques involving the generation of an electric arc between two graphite electrodes, one of which is usually filled with a catalyst metal powder (e.g., iron, nickel, cobalt), in a Helium atmosphere.
  b) Laser ablation methods using a laser to evaporate a graphite target which is usually filled with a catalyst metal powder.
  c) Chemical vapour deposition processes utilising nano-particles of a metal catalyst to react with a hydrocarbon gas at temperatures of 500-900° C. to produce carbon nanotubes. In these chemical vapour deposition processes, the catalyst decomposes the hydrocarbon gas to produce carbon and hydrogen. The carbon precipitates out from the catalyst to form the carbon nanotube.
  d) A variant of the chemical vapour deposition is plasma enhanced chemical vapour deposition in which vertically aligned carbon nanotubes can easily be grown using the plasma over a heated subsrate to decompose the hydrocarbon gas to produce the carbon. The carbon precipitates out from the catalyst to form the carbon nanotube.

The arc discharge and laser ablation techniques tend to produce an ensemble of carbonaceous material which contain nanotubes (30-70%), amorphous carbon and carbon particles. The nanotubes are then extracted by some form of purification process before being manipulated into place for specific applications.

In the Chemical Vapor deposition based growth and the Plasma enhanced Chemical Vapor Deposition based growth, the catalyst acts as a 'template' from which the carbon nanotube is formed, and, by controlling the catalyst size and reaction time, one can easily tailor the nanotube diameter and length, respectively. Semiconducting nanowires of different elements can also be grown using chemical vapour deposition via the appropriate feedstock gases or elemental vapour.

Carbon tubes, in contrast to a solid carbon filament or other semiconducting nanowires, will tend to form when the catalyst particle is ~50 nm or less. In filament graphitic sheet form, in a nano structure, there will be an enormous percentage of 'edge' atoms. These edge atoms have dangling bonds which makes the structure energetically unfavourable and unstable. The closed structure of tubular graphene shells is a stable, dangling-bond free solution to this problem, and hence the carbon nanotube is the energetically favourable and stable structural form of carbon at these tiny dimensions.

PRIOR ART

The existing art in the area of Nano-technology equipments is mainly oriented at semiconductor technology, which requires very stable temperatures and pressures in the process chamber. Even though the current disclosure is oriented at the needs of the Carbon Nano-tube and Semiconducting Nanowire applications the principles are applicable to other Nano-technology equipments where fast thermal response and/or uniform plasma over conducting or insulating substrates are important. Carbon Nanotube and semiconducting Nanowire growth operations require fast rise times and steady, controlled temperatures. Hence the prior art furnaces and reaction chambers, with their high thermal mass, are not suitable for Nano-technology applications, and this is especially true for Carbon Nanotube and Semiconducting Nanowire applications, where the temperature of the furnace has to be changed quickly and with good controllability to facilitate growth. It is also necessary to be able to bias the substrate holder, which can be the heater itself, using high voltages while maintaining the temperature control. This requires that the substrate holder be insulated from the chamber and isolated from the heating and control circuitry. The prior art thermal chambers do not generally have these characteristics needed for Carbon Nanowire and semiconducting Nanotube growth.

A second problem area in high temperature CVD and plasma CVD equipments for Nano-technology is the supply of gases uniformly to the reaction site so that the reaction can take place at the local area where deposition and growth take place. Typical semiconductor operations generate radicals in the plasma and allow them to react on a surface where deposition or etching takes place. The gases are fed into the chamber through a shower head for uniformity. What has been found is that there is an amount of thermal or plasma initiated gas phase reaction taking place at the walls of the showerhead in most equipments. This reaction, away from the growth location, in the case of the carbon Nanotube and Nanowire growth can create problems of unwanted growth on the substrate due to existing reactive products in the gas stream. Furthermore, the lifetime of the showerhead is reduced as the apertures clog from the deposited material at the showerhead.

Another area of problem in Plasma equipments used in Nano-technology is the charging of the substrate. If an insulating substrate is used in a plasma with the necessary DC bias alone, the substrate accumulates charge and prevents the radicals from reaching and reacting at the substrate, thereby limiting the process. The charge build up also causes arcing and plasma instability during deposition. In present day equipments used in the semiconductor industry, the solution to this problem is by super-imposition of a radio frequency (RF) voltage of suitable amplitude across the electrodes. This RF voltage allows the charge on the substrate to be removed due to the oscillating path of the radicals in the plasma. The introduction of RF is a very costly and difficult solution. The inventors have developed a cost effective solution to the charging problem, which solution is disclosed as part of this application.

Another common problem for controlled growth of Nanostructures on insulator material is the difficulty of applying the necessary high voltage bias to the insulating substrate, to generate the plasma and cause the necessary reaction at the surface of the insulating film. This problem has affected the successful use of prior art equipments in the growth of carbon Nanotubes and semiconducting Nanowires. The present inventors have resolved this problem of providing the bias at the surface region of the insulated substrate to enable uniform plasma and hence growth of nano structures on the substrate. This solution is also disclosed herein.

What is Disclosed is:
1. A way of improving the thermal response of Nano-technology furnaces by providing a low thermal mass, electrically isolated heater element that allows fast temperature changes with the uniformity of temperatures needed for Carbon Nanotube or semiconducting Nanowire growth.
2. A conductive showerhead with isolating apertures that eliminate the decomposition of feedstock gases at the shower head aperture for carbon nanotube and semiconducting nanowire growth.
3. A method of eliminating charging of an insulated substrate due to DC plasma in plasma enhanced chemical vapour deposition growth of carbon nanotubes of semiconducting nanowire growth on insulating substrates by use of pulsed voltage waveforms.
4. The use of a conductive frame or plate with apertures for plasma enhanced chemical vapour deposition growth of carbon nanotubes of semiconducting nanowire growth on insulating substrates to enable uniform plasma at the surface of the insulated substrate.

The first two improvements are applicable to the CVD growth system while all four improvements are applicable to the Plasma enhanced CVD growth system for nanomaterials These improvements to the equipment for a plasma enhanced growth furnace which may be in the form of a vacuum chamber will enable the furnace to be used effectively for growth of Carbon Nanotubes and semiconducting nanowires. It is hoped that availability of equipments will accelerate the growth of the technology and improve the manufacturability of nanomaterials.

EXPLANATION OF NUMBERING AND LETTERING IN THE DISCLOSED FIGURES

Figure 1:
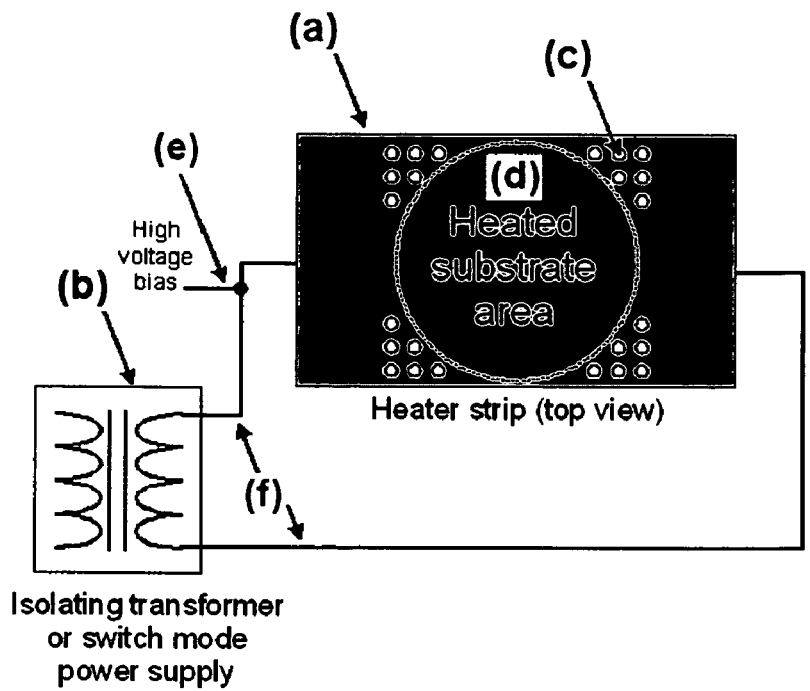
FIG. 1 is a top view of the proposed fast response, low thermal-mass heater with high voltage bias connection (for plasma generation) and isolating transformer or switch-mode power supply.
Figure 2:
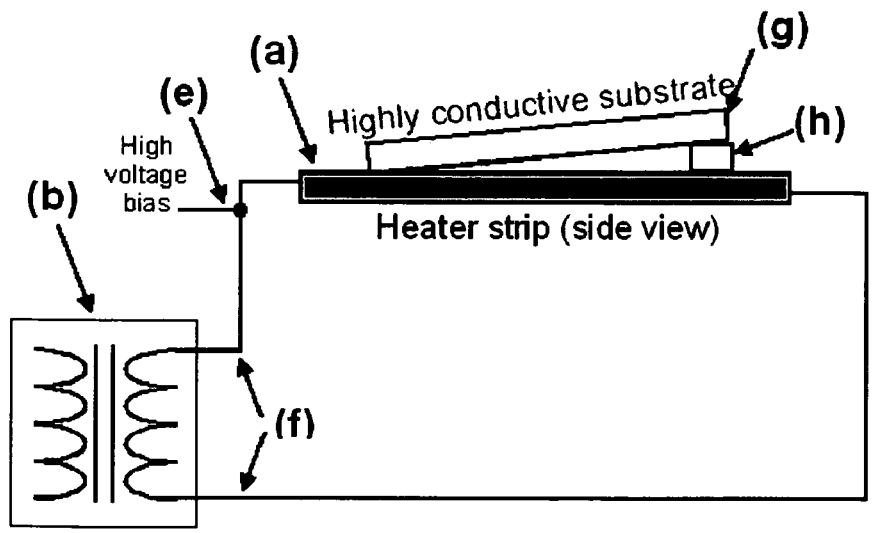
FIG. 2 shows isolation of a small size conductive substrate in a small chamber to prevent shorting of the heater element.
Figure 3:
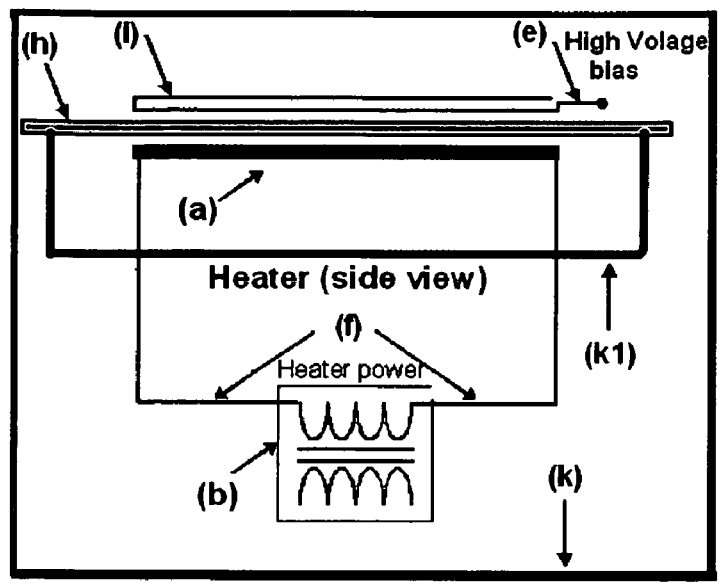
FIG. 3 is a side view of a large area fast response, low thermal mass heater for large conductive substrate with full substrate isolation, high voltage substrate bias connection and isolated heater power supply.

FIG. 1, FIG. 2 and FIG. 3
a. Low Thermal-mass heater element made up of one or more heater strips.
b. Isolating Transformer or Switch-mode power supply.
c. Holes or perforations in the heater strip or heater element to guide current flow and improve uniformity of heating in the substrate area.
d. Uniformly heated area for substrate.
e. Isolated High Voltage bias connection.
f. High Current supply terminals of the heater strip.
g. Small Conductive substrate.
h. Thin Isolation element.
k. Process Chamber
k1. Separate chamber for heating element (possible inert gas filled).
l. Physically large, thermally and electrically conductive substrate holder.

Figure 4:
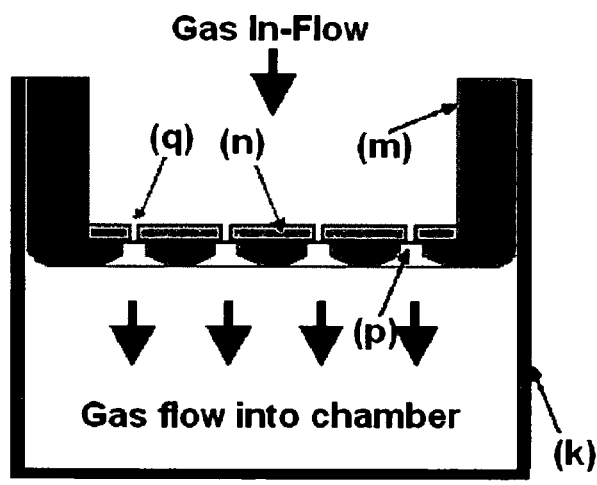
FIG. 4 shows a proposed shower head in cross section.

FIG. 4
k. Process chamber.
m. Shower head Gas chamber.
n. Insulating plate inset with smaller apertures.
p. Nozzle.
q. Aperture in insulating plate aligned to the nozzle of the shower head for gas inlet.

Figure 5A:
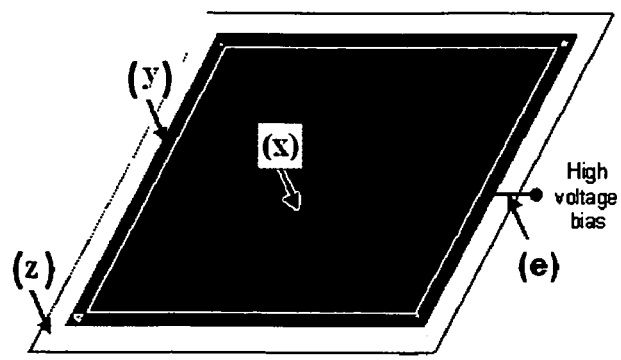
FIG. 5a shows the use of a conductive frame for generation of a bias for a high voltage plasma at the surface of an insulating substrate.
Figure 5B:
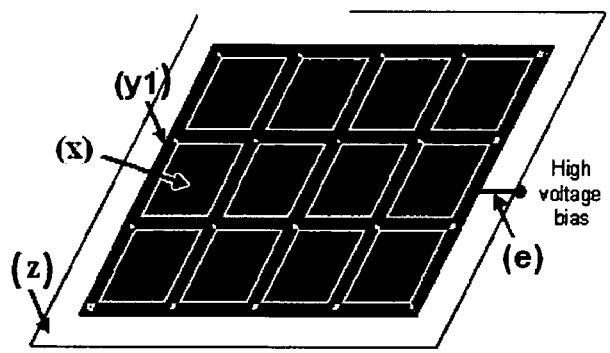
FIG. 5b shows the use of a conductive grid frame to obtain better uniformity of plasma over an insulating substrate.

FIG. 5a and FIG. 5b
x. Insulating substrate on which the growth has to take place.
y. Conductive frame placed on the insulating substrate.
y1. Conductive frame in the form of a grid placed on the insulating substrate.
z. Heater block comprising of heater element, thin isolation element and substrate without (as in FIG. 2) or with (as in FIG. 3) substrate holder.
e. High Voltage bias connection.

Figure 6:
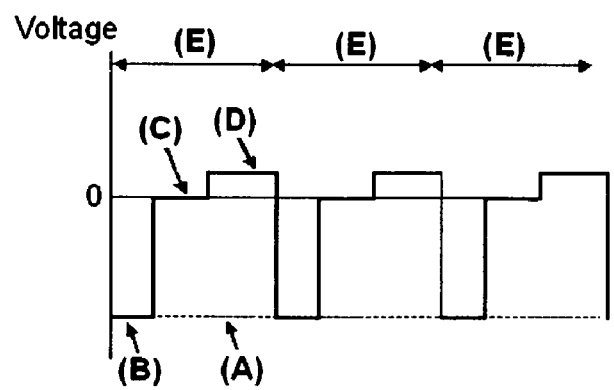
FIG. 6 shows a pulsed voltage waveform for plasma deposition on insulating or mixed insulating/conductive substrates.

FIG. 6
A. DC bias level for Plasma.
B. Pulse DC for plasma.
C. Voltage off time.
D. Voltage reversal time for charge removal.
E. Pulse repetition period (this period defines the frequency of operation).

DESCRIPTION OF INVENTION

In carbon nanotube growth processes, there are typically three key process steps—catalyst pretreatment, nanotube growth, and annealing/further crystallization of the structures. These three steps are often performed at different temperatures with minimum time between process steps and hence a low thermal mass heater design is required in order to change the temperature of the substrate rapidly between the process steps. Furthermore, in the case of plasma CVD, the substrate holder or the substrate surface must be electrically isolated such that it could be biased at high voltage for plasma processing, which is needed for obtaining aligned nanotube growth. It is in addition desirable for the heater to be uniform in temperature and a controlled value. These are achieved by the disclosed structure.

FIG. 1 shows a low thermal mass heater element that has the capability to achieve fast thermal response necessary for Nano-technology furnaces. This is especially so for the CVD and Plasma CVD furnaces used for carbon Nanotube and Nanowire growth. FIG. 2 shows a small low cost furnace for R & D applications that has the low thermal mass heater element and which uses a cheap isolation method for the conductive substrate while retaining the advantages of the fast response. FIG. 3 shows a low thermal mass heater for large conductive substrates showing the isolation method used for preventing the shorting of the heater element by the conductive substrate.

In FIG. 1, FIG. 2, and FIG. 3, a thin conductive strip of heating material (heater strip) (a), typically graphite or metal suitable for a heater, is heated resistively. Being thin and light, it has low thermal mass and hence provides fast response. In the case of FIG. 3, (a) can also be in the form of a meander or comprise of multiple heater strips (collectively called heater element) in order to cover a larger area. Electrical isolation from the main supply is achieved through use of an isolating transformer or a switch-mode power supply (b) that supplies current to heat the heater strip (a) through the terminals (f). The isolated heater strip is biased from a high voltage supply through the bias terminal (e). The strip is heated using high current. This ensures that the voltage drop at the other side of the strip is insignificant (e.g., 10V) when compared with the high voltage bias for plasma generation (e.g., 600V). The thin heater strip (a) is perforated (c) to constrict the current flow in various places to improve heater uniformity over the desired heated substrate area (d). Without these perforations, the temperature profile of the strip would be hot in the center, falling off on both sides. The use of a highly conductive substrate on the conductive heater strip in FIG. 2 will short circuit the strip, causing it not to heat up as part of the current passes through the substrate rather than the heater. For low cost R & D operations the cost of using a large insulator (h) and a second conductive substrate holder (l) as shown in FIG. 3 will be very expensive. The solution is to place a very thin small isolating material (h) at one side of the substrate such that the substrate is only in physical contact at one side of the heater strip. FIG. 3 on the other hand shows the large substrate heater usable in manufacturing where the transformer (b) and heater strip (a) are isolated from a thin conductive substrate holder (l), typically made of graphite, titanium carbide, silicon carbide or other high temperature materials, completely by a thin insulator (h). The heater element is connected to the supply transformer through terminal strips (f) while the conductive substrate holder can be biased through the connection to terminal (e). This allows the substrate holder and hence the conductive substrate to be biased independently of the heater supply in a large substrate furnace or in a manufacturing environment.

By isolating the heater strip from the substrate holder completely it is possible to have the heater enclosed in an inert gas chamber (k1) within the total process chamber (k) for longer life of the heater element.

FIG. 4 is the cross-sectional view of a modification to the shower head of the thermal CVD furnace or the plasma gas shower head of the plasma enhanced CVD furnace for the growth of nano-materials. A common problem faced by the thermal and plasma CVD shower heads is the gas phase decomposition at the nozzle or nozzle holes (p) of the conductive shower head (m), admitting the reaction gases to the chamber creating unwanted particles in the gas stream or clogging the nozzles. This happens mainly due to the fact that the shower head gets hot due to radiative heating in any CVD system and in Plasma CVD systems the shower head acts as the second voltage bias terminal for the plasma. To prevent the gas phase decomposition of the feedstock gases at the shower head a modification is proposed and disclosed for the system. The disclosed invention is to place an electrically insulating plate (n) that has smaller apertures (q) for the gas stream aligned to the larger nozzle holes (p) in the shower head, over the conductive shower head. The insulating plate with smaller aperture holes (q) than the nozzle prevents the gas coming into contact with hot walls of the nozzle. Even when the shower head acts as the second conductor for the bias applied across the chamber, the aperture (q) through which the gas enters the reaction chamber is separated from the biased shower head. This reduces the problem of unwanted gas phase reactions taking place and resultant particle formation at the nozzle or the aperture. Hence this invention disclosed reduces the defects in the nano-structures grown. Furthermore, the lifetime of the showerhead is increased due to reduced accumulation of the by-products of the reaction at the nozzle.

Another problem with the plasma CVD growth of nano structures, especially on insulating substrates or even conductive substrates with insulating coatings, is the difficulty in generating the necessary uniform bias for plasma assisted growth near the surface of the substrate. This is valid for cases of carbon nanotube and semi-conducting nanowire growth on glass, silicon wafers with oxide coating, or similar substrates. This problem has been difficult to solve in the past but a solution is presented that reduces the impact of the insulating substrate. FIG. 5a shows the use of a single conductive frame (y) for small insulated substrates, and FIG. 5b shows a conductive frame (y1) made in the form of a grid for more uniform coverage and for large substrates, that can be placed on the surface of the insulating substrate (x) to allow the bias to be applied, via the bias connection (e), close to and in a substantially uniform fashion over the insulated substrate (x) placed on the heater stack (z) to initiate and sustain the necessary high voltage over the surface of insulating substrate. This allows for uniform growth of the carbon nanotubes, nanowires and other nanostructures that need the uniform high voltage bias.

As discussed before, it is sometimes necessary to deposit on to insulating (e.g., glass) substrates or substrates with a mixture of insulating and conductive sections. Using a purely direct current (DC) plasma can cause the insulating substrate to accumulate charge which leads to reduction in growth and arcing. Microwave and RF plasmas with and without a DC bias have been used to reduce this charging, however, these are expensive solutions for the problem of charge accumulation due to the need for matching networks, generators, chamber shielding, etc. to generate, sustain and isolate the necessary high frequency fields. The heater element must also be RF shielded for proper operation, and in these cases a conventional thermocouple cannot be used for temperature readout due to RF pickup providing erroneous readings. A solution to this problem has been identified and is herein disclosed. That is, a pulsed waveform signal is used as the high voltage biasing for the plasma applied to the bias input (e) of the substrate holder, or the bias frame. FIG. 6 shows the DC pulse as used to achieve the bias and the discharge of the insulated substrate during growth operation. The typical DC bias amplitude (A) required for Plasma growth is indicated by the dotted line. The DC pulse peak amplitude and duration indicated by the solid line (B) in the figure will be equal or larger than the typical DC bias value. The pulse duration (B) is defined by the charge discharge characteristics needed for sustained growth. In order to remove the accumulated charge, the high bias voltage is turned off for a period (C), allowing natural discharge, the duration of C being determined by the process conditions in the chamber, followed by application of a low negative voltage of magnitude and duration (D) impressed on the bias terminal to clear any residual charge build up. Hence the total DC bias used comprises three periods or intervals and potentials, a first period with the high potential of the first polarity required for plasma growth, a second period where the potential is turned off to allow discharge of the substrate, and a third period where a low potential of the reverse polarity is applied to ensure complete removal of charge from the substrate. The repetition time (E) of the DC bias, consisting of the sum of these three intervals, will enable it to operate in the Hz to kHz range. This low frequency operation allows the plasma furnace to be manufactured without all the additional high cost frequency generators and the high degree of shielding needed for microwave or RF plasmas. This in turn makes the discharging circuit of the furnace a low to medium cost addition made with off the shelf components.

What is provided by the current Inventions in the equipments for Nano-Technology are:
1. A fast response thermal heater for Nano technology CVD and Plasma CVD applications, that allows the substrate temperature to be changed in a controlled and fast rate to achieve the growth conditions of Carbon Nanotubes and Semiconducting nanowires.
2. A low cost, small substrate furnace usable for development work using simple but effective insulation techniques and a much more sophisticated and large substrate furnace for manufacturing of the Nanostructures.
3. A means of reducing the gas phase reactions at the nozzles of the inlet shower head of the gas reaction chamber, thereby reducing the particles formed and defects in the grown nano structures.
4. A method to generate bias close to the growth surface of an insulated substrate by use of a frame, either a single peripheral frame for small substrates or multiple conductive grids for large substrates.
5. A means of using a pulsed waveform to remove the charging effect on insulated growth substrates in a plasma.

Even though all these advantages have been disclosed for use with the growth of carbon nanotubes and semi-conducting nanowires, it should not be construed that the applications are limited to this area alone. The use of these innovations will be many in the nanotechnology industry and will be abundantly clear to those knowledgeable in the technology and equipment fields.

What is claimed is:

1. A chemical vapour deposition (CVD) system, comprising:
    a reaction chamber;
    a heater element disposed within the reaction chamber, the heater element comprising one or more conductive strips of heating material, the strips being perforated in one or more places;
    a substrate support area adjacent to and over lying the heater element;
    an isolating power supply electrically connected to the heating element by a pair of current supply terminals;
    a biasing terminal for applying a bias to a substrate supported in the substrate support area; and
    a conducting shower head disposed within the reaction chamber above the substrate support area and the heater element, and having (i) gas inlet nozzles to admit reaction gas mixtures into the reaction chamber, and (ii) an electrically insulating plate disposed above the nozzles, the electrically insulating plate having apertures therethrough, which apertures are each aligned to and are smaller than the nozzles of the showerhead, wherein the electrically insulating plate is positioned to prevent the reaction gas mixtures admitted into the reaction chamber from coming into contact with walls of the nozzles.

2. The CVD system of claim 1, further comprising a pulsed waveform voltage biasing supply for a plasma.

3. The CVD system of claim 2, wherein the pulsed waveform voltage biasing supply provides a pulsed waveform having three periods and amplitudes, a first period of a relatively high potential DC pulse of a first polarity, a second period of zero potential, and a third period of a relatively low potential DC pulse of a second polarity, during a repetition interval of a DC bias, where the first period of relatively high potential DC pulse of the first polarity provides a growth plasma, the second period of zero potential allows for discharge of accumulated charge on the substrate, and the third period of relatively low potential DC pulse of the second polarity ensures removal of any residual charge from the substrate.

4. The CVD system of claim 1, wherein the biasing terminal is configured to be connected to a conductive substrate.

5. The CVD system of claim 1, wherein the biasing terminal is connected to a conductive frame configured to be placed over a surface of the substrate.

6. The CVD system of claim 1, wherein the heater element comprises multiple heater strips.

7. The CVD system of claim 1, wherein the substrate support area includes an electrical insulator sized to support and separate one end of the substrate from the heater element.

8. The CVD system of claim 1, wherein the heater element is enclosed in an inert gas chamber.

9. A chemical vapour deposition (CVD) system, comprising:
    a reaction chamber;
    a heater element disposed within the reaction chamber, the heater element comprising one or more conductive strips of heating material, the strips being perforated in one or more places;
    an isolating power supply electrically connected to the heating element by a pair of current supply terminals;
    a biasing terminal for applying a bias to a substrate within the reaction chamber; and
    a shower head disposed within the reaction chamber above the heater element and having (i) a conducting surface with gas inlet nozzles therethrough to admit reaction gas mixtures into the reaction chamber, and (ii) an electrically insulating plate disposed above the nozzles and abutting the conducting surface, the electrically insulating plate having apertures therethrough, which apertures are each aligned to and are smaller than the nozzles of the showerhead.

10. The CVD system of claim 9, further comprising a substrate support over lying the heater element for supporting the substrate in the reaction chamber.

11. The CVD system of claim 10, wherein the substrate support area includes an electrical insulator sized to support and separate one end of the substrate from the heater element.

12. The CVD system of claim 9, further comprising a pulsed waveform voltage biasing supply for a plasma.

13. The CVD system of claim 12, wherein the pulsed waveform voltage biasing supply provides a pulsed waveform having three periods and amplitudes.

14. The CVD system of claim 9, wherein the biasing terminal is configured to be connected to a conductive substrate.

15. The CVD system of claim 9, wherein the biasing terminal is connected to a conductive frame configured to be placed over a surface of the substrate.

16. The CVD system of claim 9, wherein the heater element comprises multiple heater strips.

17. The CVD system of claim 9, wherein the heater element is enclosed in an inert gas chamber.

* * * * *

UNITED STATES PATENT AND TRADEMARK OFFICE
CERTIFICATE OF CORRECTION

| | |
|---|---|
| PATENT NO. | : 7,842,135 B2 |
| APPLICATION NO. | : 11/327975 |
| DATED | : November 30, 2010 |
| INVENTOR(S) | : Kenneth Boh Khin Teo and Nalin Lalith Rupesinghe |

It is certified that error appears in the above-identified patent and that said Letters Patent is hereby corrected as shown below:

On the Title Page Item (54) and col. 1 lines 1-5 in the Title section:

• EQUIPMENT INNOVATIONS FOR NANO-TECHNOLOGY AQUIPMENT, ESPECIALLY FOR PLASMA GROWTH CHAMBERS OF CARBON NANOTUBE AND NANOWIRE should read
-- EQUIPMENT INNOVATIONS FOR NANO-TECHNOLOGY EQUIPMENT, ESPECIALLY FOR PLASMA GROWTH CHAMBERS OF CARBON NANOTUBE AND NANOWIRE --.

Signed and Sealed this
Eighteenth Day of January, 2011

David J. Kappos
*Director of the United States Patent and Trademark Office*